(12) United States Patent
Li et al.

(10) Patent No.: US 7,099,187 B2
(45) Date of Patent: Aug. 29, 2006

(54) READ/WRITE CIRCUIT FOR ACCESSING CHALCOGENIDE NON-VOLATILE MEMORY CELLS

(75) Inventors: Bin Li, Chantilly, VA (US); Kenneth R. Knowles, Manassas, VA (US); David C. Lawson, Haymarket, VA (US)

(73) Assignees: BAE Systems Information and Electronic Systems Integration Inc., Nashua, NH (US); Ovonyx, Inc., Rochester Hills, MI (US)

( * ) Notice: Subject to any disclaimer, the term of this patent is extended or adjusted under 35 U.S.C. 154(b) by 0 days.

(21) Appl. No.: 11/225,953

(22) Filed: Sep. 14, 2005

(65) Prior Publication Data

US 2006/0013037 A1    Jan. 19, 2006

Related U.S. Application Data

(62) Division of application No. 10/631,174, filed on Jul. 31, 2003, now Pat. No. 6,965,521.

(51) Int. Cl.
*G11C 11/00* (2006.01)
(52) U.S. Cl. ...................................... 365/163; 365/113
(58) Field of Classification Search ................ 365/163, 365/113, 189.01
See application file for complete search history.

(56) References Cited

U.S. PATENT DOCUMENTS

| | | | | |
|---|---|---|---|---|
| 5,881,002 A | * | 3/1999 | Hamakawa | 365/195 |
| 6,493,275 B1 | * | 12/2002 | Tomita | 365/189.09 |
| 6,914,828 B1 | * | 7/2005 | Kono | 365/189.01 |
| 6,928,022 B1 | * | 8/2005 | Cho et al. | 365/225.7 |
| 6,930,940 B1 | * | 8/2005 | Haraguchi | 365/203 |

* cited by examiner

*Primary Examiner*—Huan Hoang
(74) *Attorney, Agent, or Firm*—Daniel J. Long; Anthony P. Ng; Dillon & Yudell LLP

(57) ABSTRACT

A read/write circuit for accessing chalcogenide non-volatile memory cells is disclosed. The read/write circuit includes a chalcogenide storage element, a voltage limiting circuit, a current-to-voltage converter, and a buffer circuit. The voltage limiting circuit, which is coupled to the chalcogenide storage element, ensures that voltages across the chalcogenide storage element will not exceed a predetermined value during a read operation. During a read operation, the current-to-voltage converter, which is coupled to the voltage limiting circuit, converts a current pulse read from the chalcogenide storage element to a voltage pulse. By sensing the voltage pulse from the current-to-voltage converter, the buffer circuit can determine a storage state of the chalcogenide storage element.

4 Claims, 2 Drawing Sheets

READ/WRITE CIRCUIT FOR ACCESSING CHALCOGENIDE NON-VOLATILE MEMORY CELLS

CROSS-REFERENCE TO RELATED APPLICATIONS

The present application is a divisional of U.S. patent application Ser. No. 10/631,174, filed on Jul. 31, 2003 now U.S. Pat. No. 6,965,521. Applicants hereby claim benefit of priority under 35 U.S.C. §120 to U.S. patent application Ser. No. 10/631,174, which is incorporated by reference herein in its entirety and for all purposes.

The present invention was made with Government Support under contract (Grant) No. SC-0244-00-0002 awarded by the United States Air Force. The Government has certain rights in the present invention.

BACKGROUND OF THE INVENTION

1. Technical Field

The present invention relates to memory circuits in general, and in particular to memory circuits having chalcogenide cells. Still more particularly, the present invention relates to a read/write circuit for accessing chalcogenide memory cells.

2. Description of the Related Art

The use of electrically writable and erasable phase change materials for electronic memory applications is known in the art. Such phase change materials can be electrically switched between a first structural state where the material is generally amorphous and a second structural state where the material is generally crystalline. The phase change material exhibits different electrical characteristics depending upon its state. For example, in its amorphous state, the phase change material exhibits a lower electrical conductivity than it does in its crystalline state. The phase change material may also be electrically switched between different detectable states of local order across the entire spectrum ranging from the completely amorphous state to the completely crystalline state. In other words, the state switching of the phase change materials is not limited to either completely amorphous or completely crystalline states but rather in incremental steps to provide a "gray scale" represented by a multiplicity of conditions of local order spanning the spectrum from the completely amorphous state to the completely crystalline state.

General speaking, phase change material memory cells are monolithic, homogeneous, and formed of chalcogenide material containing chemical elements selected from the group of Tellurium (Te), Selenium (Se), Antimony (Sb), Nickel (Ni), and Germanium (Ge). Chalcogenide memory cells can be switched between two different electrically detectable states within nanoseconds in response to an input of picojoules of energy. Chalcogenide memory cells are truly non-volatile and can maintain the stored information without the need for periodic refreshing. Furthermore, the stored information remain intact even when power is removed from the chalcogenide memory cells.

The present disclosure describe a read/write circuit for accessing chalcogenide memory cells.

SUMMARY OF THE INVENTION

In accordance with a preferred embodiment of the present invention, a non-volatile memory includes a chalcogenide storage element, a voltage limiting circuit, a current-to-voltage converter, and a buffer circuit. The voltage limiting circuit, which is coupled to the chalcogenide storage element, ensures that voltages across the chalcogenide storage element will not exceed a predetermined value during a read operation. During a read operation, the current-to-voltage converter, which is coupled to the voltage limiting circuit, converts a current pulse read from the chalcogenide storage element to a voltage pulse. By sensing the voltage pulse from the current-to-voltage converter, the buffer circuit can determine a storage state of the chalcogenide storage element.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
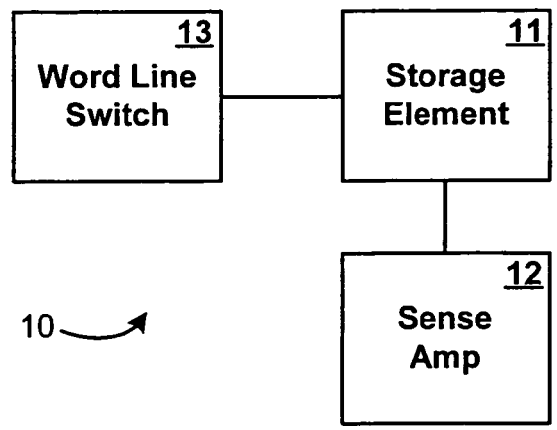
FIG. 1 is a block diagram of a static random access memory, according to the prior art.

Referring now to the drawings and in particular to FIG. 1, there is illustrated a block diagram of a static random access memory (SRAM), according to the prior art. As shown, a SRAM 10 includes a storage element 11 coupled to a sense amplifier 12. Data in and out of storage element 11 are controlled by a wordline switch 13. Storage element 11 is commonly made of cross-coupled inverters, as it is well-known to those skilled in the art. During a write operation, writeline switch 13 turns on a corresponding wordline to allow data to be written into storage element 11. During a read operation, the data stored within storage element 11 is read via sense amplifier 12. A major drawback of SRAM 10 is that data stored in storage element 11 will be lost if the power to SRAM 10 is momentarily interrupted.

Figure 2:
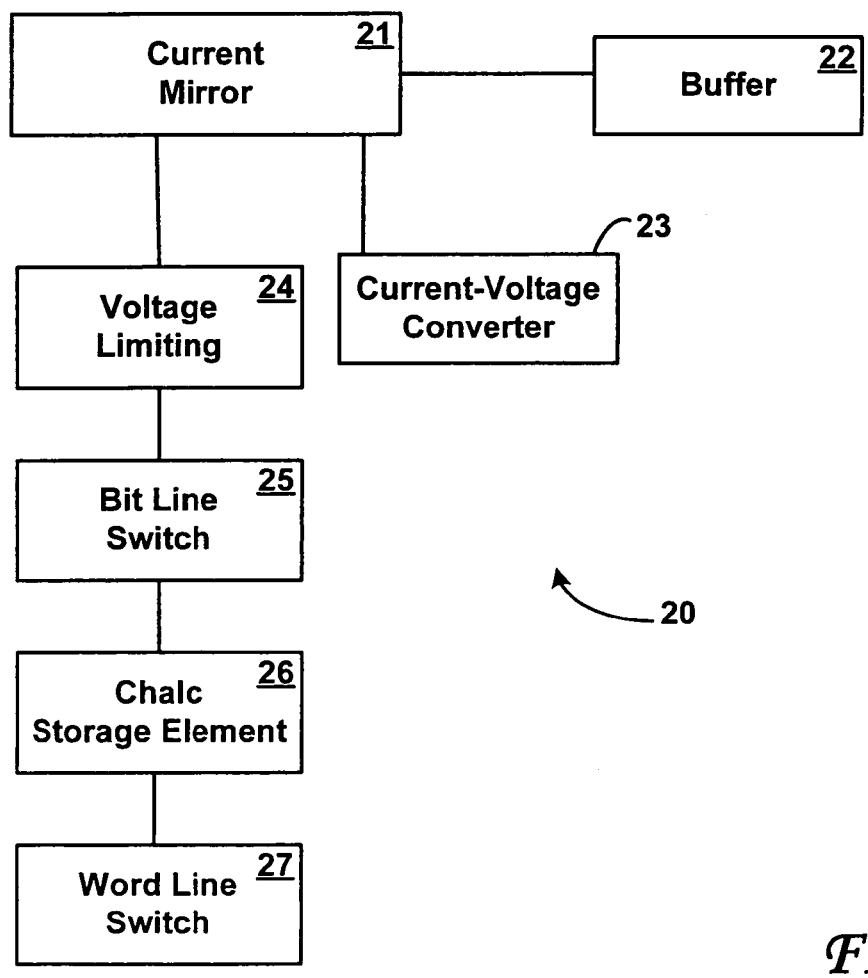
FIG. 2 is a block diagram of a chalcogenide random access memory, in accordance with a preferred embodiment of the present invention.

With reference now to FIG. 2, there is depicted a block diagram of a chalcogenide random access memory (CRAM), in accordance with a preferred embodiment of the present invention. As shown, a CRAM 20 includes a chalcogenide storage element 26 and a wordline switch 27. As its name implies, chalcogenide storage element 26 includes a memory cell formed of chalcogenide material containing chemical elements selected from the group of Tellurium (Te), Selenium (Se), Antimony (Sb) and Germanium (Ge). In addition, CRAM 20 also includes various circuits for accessing chalcogenide storage element 26, such as a current mirror 21, a buffer 22, a current-voltage converter 23, a voltage limiting circuit 24 and a bitline switch 25.

Figure 3:
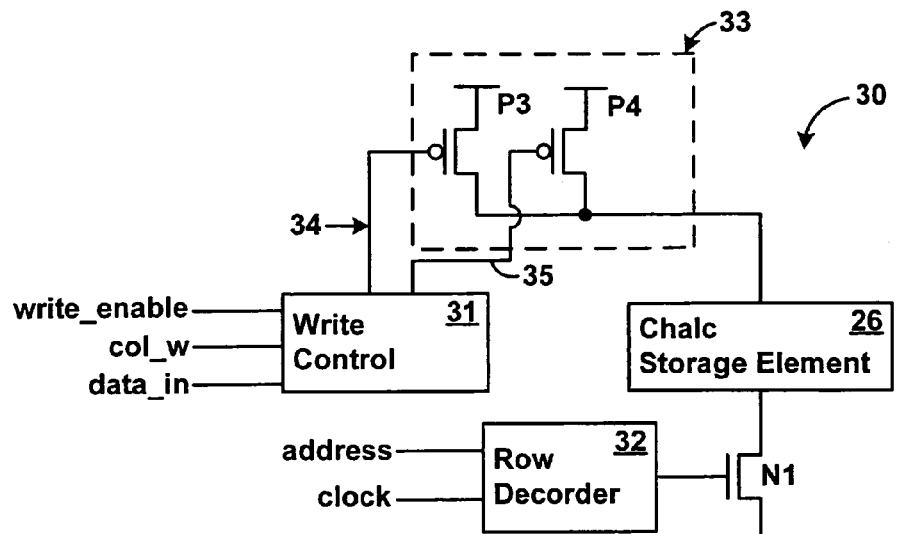
FIG. 3 is a circuit diagram of a write circuit for writing data to the chalcogenide random access memory from FIG. 2, in accordance with a preferred embodiment of the present invention.

Referring now to FIG. 3, there is depicted a circuit diagram of a write circuit for writing data to CRAM 20, in accordance with a preferred embodiment of the present invention. As shown, a write circuit 30 includes a write control circuit 31, a row decoder 32 and a write current supply circuit 33. Write control circuit 31 receives three separate inputs, namely, a write_enable input, a col_write input and a data_in input. In turn, write control circuit 31 generates a first output 34 and a second output 35 for controlling the gate of a p-channel transistor P3 and the gate of a p-channel transistor P4, respectively, within write current supply circuit 33. The drains of transistors P3 and P4 are connected to a power supply $V_{DD}$. The sources of transistors P3 and P4 are connected to chalcogenide storage element 26. Chalcogenide storage element 26 is connected to ground via a row pass n-channel transistor N1. Row decoder 32 receives an address input and a clock input for controlling the gate of row pass transistor N1.

Under the control of write control circuit 31, write current supply circuit 33 writes data to chalcogenide storage element 26. When the write_enable input to write control circuit 31 is at a logical high, and the col_write input to write control circuit 31 is also at a logical high because of a selected address, either p-channel transistor P3 or p-channel transistor P4 within write current supply circuit 33 will be turned on, depending on whether the data at the data_in input to write control circuit 31 is at a logical high or a logical low. In the meantime, with the selected address, row pass transistor N1 is turned on when the clock signal to row decoder 32 is at a logical high. Since row pass transistor N1 is turned on and either p-channel transistor P3 or p-channel transistor P4 is also turned on, a certain amount of current begins to flow through chalcogenide storage element 26, which makes chalcogenide storage element 26 change its phase, either from an amorphous phase to a crystalline phase or from a crystalline phase to an amorphous phase. The required current for chalcogenide storage element 24 to reach an amorphous phase and a crystalline phase are preferably 1 mA and 0.5 mA, respectively.

Figure 4:
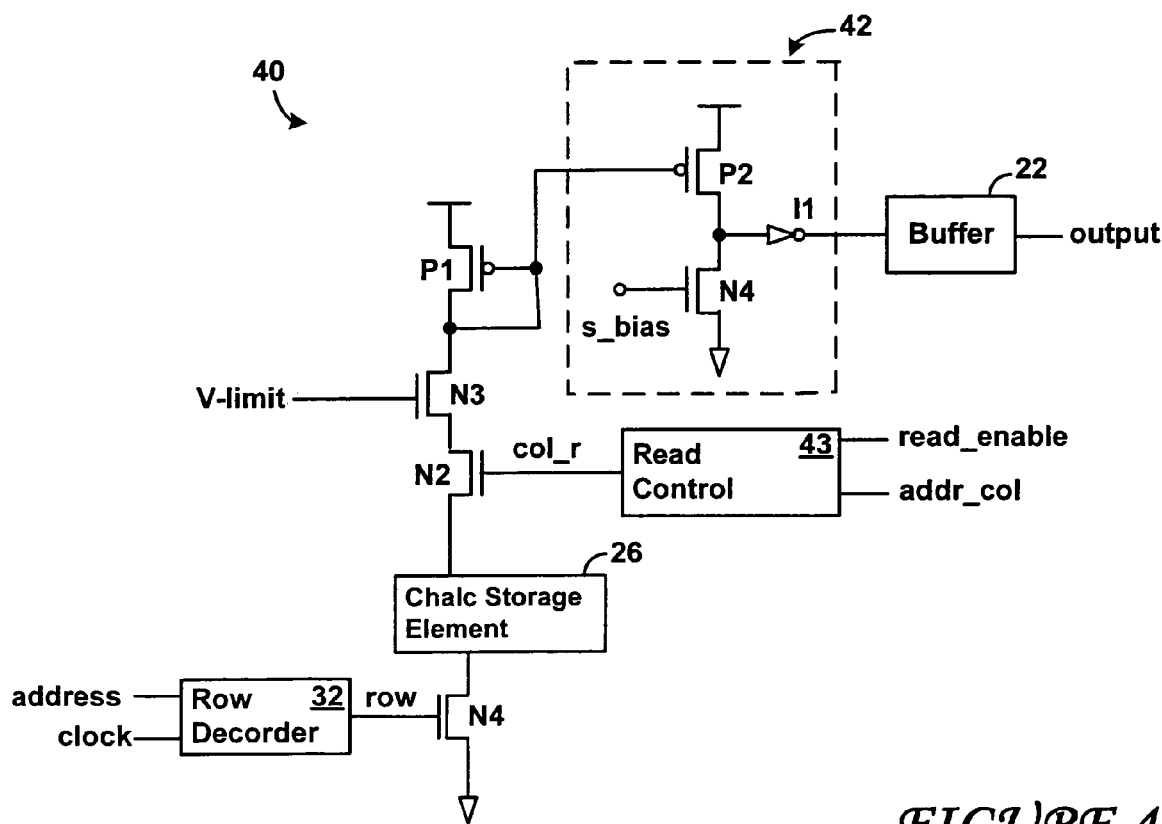
FIG. 4 is a circuit diagram of a read circuit for reading data from the chalcogenide random access memory from FIG. 2, in accordance with a preferred embodiment of the present invention.

With reference now to FIG. 4, there is depicted a circuit diagram of a read circuit for reading data from CRAM 20, in accordance with a preferred embodiment of the present invention. As shown, a read circuit 40 includes a read control circuit 43, row decoder. 32 and a current-to-voltage converter circuit 42. Read control circuit 43 receives two separate inputs, namely, a read_enable input and an address_column input. In turn, read control circuit 41 generates a column_read signal for controlling the gate of a column read pass n-channel transistor N2. A p-channel transistor P1, an n-channel transistor N3, n-channel transistor N2, chalcogenide storage element 26 and an n-channel transistor N4 are connected between power supply $V_{DD}$ and ground.

Current-to-voltage converter circuit 42 includes a p-channel transistor P2, an n-channel transistor N4 and an inverter 11. Current-to-voltage converter circuit 42 generates a data output signal via a buffer 22. Row decoder 32 receives an address input and a clock input for controlling the gate of row pass n-channel transistor N4.

Under the control of read control circuit 43, current-to-voltage converter circuit 42 reads data from chalcogenide storage element 26. When the read_enable input to read control circuit 43 is at a logical high and the address_column input to read control circuit 43 is also at a logical high because of a selected address to row decoder 32, column read pass transistor N2 is turned on. Row pass transistor N4 is also turned on once both the selected address input and clock input to row decoder 32 are at a logical high.

Since both column read pass transistor N2 and row pass transistor N4 are turned on, the current should flow from $V_{DD}$ through transistor P1, transistor N3, transistor N2, chalcogenide storage element 24, and transistor N4 to ground, which generates a current pulse. The amplitude of the generated current pulse is determined by the phase of chalcogenide storage element 26. The conductive state of chalcogenide storage element 26 is then sensed and converted to a voltage pulse by current-to-voltage converter circuit 42. The voltage pulse is then bufferred out by buffer circuit 22. The voltage across chalcogenide storage element 26 is strictly limited because of a predetermined V_limit applied to the gate of transistor N3.

There are two important constraints on a read operation: first, the voltage across chalcogenide storage element 26 cannot exceed a threshold voltage level (otherwise, the phase of chalcogenide storage element 26 may be altered); and second, the read current flow through chalcogenide storage element 26 should be smaller than the value that could change the phase of chalcogenide storage element 26.

As has been described, the present invention provides a read/write circuit for accessing a single chalcogenide memory cell. Although only one chalcogenide storage element is utilized to illustrate the present invention, it is understood by those skilled in the art that two chalcogenide storage elements can be associated with a logical data bit by utilizing a double-ended or "differential" version of the above-described single-ended circuit. The doubled-end circuit is similar to the above-described single-ended circuit except that there is a complementary data input with its own read and write circuits to store the complement of each input data bit in a chalcogenide storage element, and a differential amplifier circuit is utilized to sense the complementary data bits stored. The differential design of the true-and-complement value of each logical data bit provides a higher noise margin and thus provides a greater reliability for each data bit stored in case of a defect exists in the input signals or the chalcogenide memory chip.

While the invention has been particularly shown and described with reference to a preferred embodiment, it will be understood by those skilled in the art that various changes in form and detail may be made therein without departing from the spirit and scope of the invention.

What is claimed is:

1. A write circuit for writing data to a non-volatile memory, said write circuit c comprising:
   a chalcogenide storage element;
   a write control circuit for receiving a write_enable input, a col_write input and a data_in input;
   a row decoder circuit, coupled to said chalcogenide storage element, for receiving an address input and a clock input; and
   a write current supply circuit, coupled to said write control circuit and said chalcogenide storage element, for writing data to said chalcogenide storage element during a write operation under the control of said write control circuit.

2. The write circuit of claim 1, wherein said write current supply circuit includes two p-channel transistors.

3. The write circuit of claim 1, wherein said chalcogenide storage element is capable of changing from an amorphous phase to a crystalline phase, or vice versa, via an application of an appropriate amount of current.

4. The write circuit of claim 3, wherein current for said chalcogenide storage element to reach said amorphous phase and said crystalline phase are 1 mA and 0.5 mA, respectively.

* * * * *

UNITED STATES PATENT AND TRADEMARK OFFICE
CERTIFICATE OF CORRECTION

| | | |
|---|---|---|
| PATENT NO. | : 7,099,187 B2 | Page 1 of 1 |
| APPLICATION NO. | : 11/255953 | |
| DATED | : August 29, 2006 | |
| INVENTOR(S) | : Li et al. | |

It is certified that error appears in the above-identified patent and that said Letters Patent is hereby corrected as shown below:

Column 4, lines 42-43, delete "A write circuit for writing data to a non-volatile memory, said write circuit c comprising:" and insert --A write circuit for writing data to a non-volatile memory, said write circuit comprising:--.

Signed and Sealed this

Twelfth Day of December, 2006

JON W. DUDAS
*Director of the United States Patent and Trademark Office*